United States Patent
Meguro et al.

(10) Patent No.: US 10,529,615 B2
(45) Date of Patent: *Jan. 7, 2020

(54) METHOD FOR MANUFACTURING A BONDED SOI WAFER AND BONDED SOI WAFER

(71) Applicant: SHIN-ETSU HANDOTAI CO., LTD., Tokyo (JP)

(72) Inventors: Kenji Meguro, Nagano (JP); Taishi Wakabayashi, Nagano (JP); Norihiro Kobayashi, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/303,596

(22) PCT Filed: Mar. 5, 2015

(86) PCT No.: PCT/JP2015/001195
§ 371 (c)(1),
(2) Date: Oct. 12, 2016

(87) PCT Pub. No.: WO2015/162842
PCT Pub. Date: Oct. 29, 2015

(65) Prior Publication Data
US 2017/0033002 A1 Feb. 2, 2017

(30) Foreign Application Priority Data
Apr. 24, 2014 (JP) ................................ 2014-090290

(51) Int. Cl.
*H01L 21/02* (2006.01)
*H01L 21/762* (2006.01)
(Continued)

(52) U.S. Cl.
CPC .......... *H01L 21/76251* (2013.01); *B32B 7/12* (2013.01); *B32B 9/04* (2013.01);
(Continued)

(58) Field of Classification Search
CPC ............... H01L 27/12; H01L 21/30625; H01L 21/0262; H01L 21/02595; H01L 21/02532;
(Continued)

(56) References Cited

U.S. PATENT DOCUMENTS 4,631,804 A * 12/1986 Roy .................... H01L 21/3221
148/DIG. 122
4,742,020 A 5/1988 Roy
(Continued)

FOREIGN PATENT DOCUMENTS

| CN | 102640278 A | 8/2012 |
| CN | 103460371 A | 12/2013 |

(Continued)

OTHER PUBLICATIONS

Jun. 2, 2015 International Search Report issued in Patent Application No. PCT/JP2015/001195.
(Continued)

*Primary Examiner* — Savitri Mulpuri
(74) *Attorney, Agent, or Firm* — Oliff PLC (57) ABSTRACT

A bonded SOI wafer is manufactured by bonding a bond and a base wafer, each composed of a silicon single crystal, via an insulator film, depositing a polycrystalline silicon layer on the bonding surface side of the base wafer, polishing a surface of the polycrystalline silicon layer, forming the insulator film on the bonding surface of the bond wafer, bonding the polished surface of the polycrystalline silicon layer and the bond wafer via the insulator film, and thinning the bonded bond wafer to form an SOI layer; wherein, the (Continued)

base wafer is a silicon single crystal wafer having a resistivity of 100 Ω·cm or more, depositing the polycrystalline silicon layer further includes a stage for previously forming an oxide film on the surface of the base wafer on which the polycrystalline silicon layer is deposited, and the polycrystalline silicon layer is deposited at a temperature of 900° C. or more.

3 Claims, 3 Drawing Sheets

(51) Int. Cl.
  *B32B 7/12* (2006.01)
  *B32B 9/04* (2006.01)
  *H01L 21/306* (2006.01)
(52) U.S. Cl.
  CPC .. *H01L 21/02233* (2013.01); *H01L 21/02532* (2013.01); *H01L 21/02595* (2013.01); *H01L 21/30625* (2013.01); *B32B 2250/02* (2013.01); *B32B 2255/20* (2013.01); *B32B 2307/206* (2013.01); *B32B 2457/14* (2013.01)
(58) Field of Classification Search
  CPC ......... H01L 21/76256; H01L 21/02428; H01L 21/02381; H01L 21/02307; H01L 21/02164; H01L 21/02488; H01L 21/32055; H01L 21/02238; H01L 21/02052; H01L 21/02; H01L 21/02233; H01L 21/76251; H01L 21/76254; B32B 9/04; B32B 7/12
  See application file for complete search history.

(56) References Cited

U.S. PATENT DOCUMENTS

| | | | |
|---|---|---|---|
| 4,897,360 A | 1/1990 | Guckel et al. | |
| 5,138,421 A | 8/1992 | Saito | |
| 5,863,659 A * | 1/1999 | Kobayashi | H01L 21/304 257/627 |
| 6,091,112 A * | 7/2000 | Kwon | H01L 21/76251 257/347 |
| 6,174,740 B1 * | 1/2001 | Ohta | G01N 33/20 438/14 |
| 6,479,166 B1 | 11/2002 | Heuer et al. | |
| 6,902,977 B1 * | 6/2005 | Kluth | H01L 21/28035 257/E21.197 |
| 6,991,999 B2 | 1/2006 | Fu et al. | |
| 8,895,435 B2 * | 11/2014 | Lin | H01L 21/28035 257/754 |
| 8,962,450 B2 * | 2/2015 | Reynaud | H01L 21/76254 438/458 |
| 9,018,031 B2 * | 4/2015 | Tsukamoto | H01L 27/14632 438/459 |
| 9,356,171 B2 * | 5/2016 | Liu | H01L 31/0368 |
| 2002/0045329 A1 * | 4/2002 | Oi | H01L 21/2007 438/524 |
| 2002/0068420 A1 * | 6/2002 | Goodwin | H01L 21/32055 438/459 |
| 2003/0025198 A1 | 2/2003 | Chrysler et al. | |
| 2003/0047734 A1 * | 3/2003 | Fu | H01L 21/28035 257/64 |
| 2004/0266055 A1 * | 12/2004 | Ravi | C23C 16/272 438/105 |
| 2006/0166451 A1 | 7/2006 | Raskin et al. | |
| 2007/0032040 A1 | 2/2007 | Lederer | |
| 2009/0104752 A1 * | 4/2009 | Yoshida | H01L 21/76256 438/459 |
| 2011/0186840 A1 * | 8/2011 | Jerome | H01L 21/02381 257/49 |
| 2012/0319121 A1 | 12/2012 | Reynaud et al. | |
| 2014/0038388 A1 | 2/2014 | Reynaud et al. | |
| 2014/0084290 A1 | 3/2014 | Allibert et al. | |

FOREIGN PATENT DOCUMENTS

| | | |
|---|---|---|
| JP | H03-132055 A | 6/1991 |
| JP | H05-226464 A | 9/1993 |
| JP | 2007-507093 A | 3/2007 |
| JP | 2007-507100 A | 3/2007 |
| JP | 2010-278160 A | 12/2010 |
| JP | 2012-164906 A | 8/2012 |
| JP | 2013-513234 A | 4/2013 |

OTHER PUBLICATIONS

Oct. 30, 2017 Office Action issued in Singaporean Patent Application No. 11201608563S.
Nov. 10, 2017 Extended European Search Report issued in European Patent Application No. 15782293.3.
Jun. 5, 2018 Office Action issued in Chinese Application No. 201580020540.9.
Oct. 4, 2018 Office Action issued in U.S. Appl. No. 15/304,452.
Jan. 10, 2019 Office Action issued in U.S. Appl. No. 15/304,452.
Aug. 16, 2018 Office Action issued in Singapore Application No. 11201608563S.
Jun. 4, 2018 Office Action issue in Chinese Application No. 201580020538.1.

* cited by examiner

METHOD FOR MANUFACTURING A BONDED SOI WAFER AND BONDED SOI WAFER

BACKGROUND OF THE INVENTION

1. Field of the Invention

The present invention relates to a method for manufacturing a bonded SOI wafer and a bonded SOI wafer.

2. Description of the Related Art

As an SOI wafer for a RF (Radio Frequency) device, the SOI wafer has been treated by increasing the resistivity of the base wafer. However, it has been required to cope with higher frequency in order to handle further speedup, and accordingly it comes to be difficult to handle only by using conventional high-resistance wafers.

As a countermeasure, it has been proposed to add a layer which is effective in annihilating generated carriers (a carrier trap layer) immediately under a buried oxide film layer (a BOX layer) of an SOI wafer. Accordingly, it is becoming necessary to form a high-resistance polycrystalline silicon layer on a base wafer to recombine carriers generated in a high-resistance wafer.

Patent Literature 1 describes forming a polycrystalline silicon layer or an amorphous silicon layer as a carrier trap layer on the interface of a BOX layer and a base wafer.

On the other hand, Patent Literature 2 also describes forming a polycrystalline layer as a carrier trap layer on the interface of a BOX layer and a base wafer, and further limits the temperature of a heat treatment after forming the polycrystalline silicon layer in order to prevent re-crystallization of the polycrystalline silicon layer.

Patent Literature 3 describes that a surface roughness on the surface side to be bonded with a bond wafer of a base wafer is enlarged to obtain a similar effect to a carrier trap layer, although it does not describes formation of a polycrystalline silicon layer or an amorphous silicon layer as a carrier trap layer.

CITATION LIST

Patent Literature

Patent Literature 1: Japanese Unexamined Patent Publication (Kohyou) No. 2007-507093
Patent Literature 2: Japanese Unexamined Patent Publication (Kohyou) No. 2013-513234
Patent Literature 3: Japanese Unexamined Patent Publication (Kokai) No. 2010-278160

SUMMARY OF THE INVENTION

As described above, in order to produce a device to cope with higher frequency, it is becoming necessary to form a carrier trap layer under a FOX layer of an SOI wafer.

When an ordinary polycrystalline silicon layer is deposited to form a carrier trap layer, however, there has been a problem in which the polycrystalline silicon layer is annealed to occur single-crystallization depending on a thermal history during the step for manufacturing an SOI wafer or the step for manufacturing a device, and to cause to decrease the effect as a carrier trap layer.

Accordingly, it is necessary not to promote single-crystallization even when a heat treatment is performed after depositing a polycrystalline silicon layer. In other words, it is necessary to deposit a polycrystalline silicon layer in which single-crystallization does not occur even though being subjected to a heat treatment step in a step for manufacturing an SOI wafer or a heat treatment step in a step for manufacturing a device, with the effect being sustained at low cost.

None of the Patent Literatures 1 to 3 discloses nor suggests the technology in which single-crystallization is not promoted even when a polycrystalline silicon layer is subjected to a heat treatment after being deposited.

The present invention was accomplished in view of the above-described problems, and it is an object of the present invention to provide a method for manufacturing a bonded SOI wafer which can deposit a polycrystalline silicon layer so as not to promote single-crystallization even though being subjected to a heat treatment step in a step for manufacturing an SOI wafer or a heat treatment step in a step for manufacturing a device.

To achieve the object described above, the present invention provides a method for manufacturing a bonded SOI wafer by bonding a bond wafer and a base wafer, each composed of a silicon single crystal, via an insulator film, comprising the steps of:

depositing a polycrystalline silicon layer on the bonding surface side of the base wafer, polishing a surface of the polycrystalline silicon layer, forming the insulator film on the bonding surface of the bond wafer, bonding the polished surface of the polycrystalline silicon layer of the base wafer and the bond wafer via the insulator film, and thinning the bonded bond wafer to form an SOI layer; wherein, as the base wafer, a silicon single crystal wafer having a resistivity of 100 Ω·cm or more is used, the step for depositing the polycrystalline silicon layer further comprises a stage for previously forming an oxide film on the surface of the base wafer on which the polycrystalline silicon layer is deposited, and the polycrystalline silicon layer is deposited at a temperature of 900° C. or more.

By previously forming an oxide film between the surface of a silicon single crystal of a base wafer and a polycrystalline silicon layer to be deposited as described above, it is possible to suppress single-crystallization due to a heat treatment of a step for manufacturing an SOI wafer or a heat treatment of a step for manufacturing a device after deposition.

Moreover, by setting the deposition temperature to a temperature of 900° C. or more, it is possible to suppress grain growth of a polycrystalline silicon layer and to sustain an effect as a carrier trap layer thereby, even when the temperature of a heat treatment step of a step for manufacturing an SOI wafer or a heat treatment of a step for manufacturing a device is relatively high (e.g., about 1000 to 1200° C.).

The oxide film is preferably formed by wet cleaning.

The interposition of an oxide film between a base wafer and a polycrystalline silicon layer can influence the property of an RF device. Accordingly, it is preferable to form the oxide film with the thickness being thinner, for example, a thickness of 10 nm or less is preferable. The method for forming an oxide film with such a thickness includes wet cleaning as the most convenient method.

In this case, the polycrystalline silicon layer is preferably deposited at a temperature of 1010° C. or less.

When an oxide film is formed in several nm by wet cleaning, if the temperature for depositing a polycrystalline silicon layer thereon is 1010° C. or less, it is possible to suppress promotion of single-crystallization of the polycrystalline silicon layer due to contact between the surface of a silicon single crystal of a base wafer and the polycrystalline silicon layer caused by disappearance of a part of an underlying oxide film during a step for depositing the polycrystalline silicon layer.

After depositing the polycrystalline silicon layer, it is preferable to perform a heat treatment in a non-oxidizing atmosphere at a temperature higher than the temperature at which the polycrystalline silicon layer is deposited, and to bond the base wafer and the bond wafer afterward.

In order to enhance an effect as a carrier trap layer, it is preferable to thicken the thickness of a polycrystalline silicon layer. Still, when the thickness of the polycrystalline silicon layer is thicker, the warpage of a wafer after deposition becomes larger to cause a bond failure. The warpage of a wafer can be suppressed, however, by performing a heat treatment in a non-oxidizing atmosphere at a temperature higher than the temperature at which the polycrystalline silicon layer is deposited after depositing a polycrystalline silicon layer and before bonding.

In this case, the polycrystalline silicon layer preferably has a thickness of 2 µm or more when the base wafer and the bond wafer are bonded.

By setting the thickness of the polycrystalline silicon layer to 2 µm or more when the base wafer and the bond wafer are bonded, the frequency of a bond failure increases due to warpage of a wafer. However, when a heat treatment has been performed in a non-oxidizing atmosphere at a high temperature, the warpage of a wafer can be suppressed, and accordingly the bond failure can be lowered while enhancing the effect as a carrier trap layer, even when the thickness of the polycrystalline silicon layer is 2 µm or more when the base wafer and the bond wafer are bonded.

The present invention also provides a bonded SOI wafer comprising:
 a base wafer composed of a silicon single crystal,
 a polycrystalline silicon layer on the base wafer,
 an insulator film on the polycrystalline silicon layer, and
 an SOI layer on the insulator film; wherein
 the base wafer has a resistivity of 100 Ω·cm or more, and
 the oxygen concentration at the boundary of the base wafer and the polycrystalline silicon layer is higher than the oxygen concentration in the base wafer and the oxygen concentration in the polycrystalline silicon layer.

When the oxygen concentration at the boundary of the base wafer and the polycrystalline silicon layer is higher than the oxygen concentration in the base wafer and the oxygen concentration in the polycrystalline silicon layer as described above, single-crystallization of the polycrystalline silicon layer can be suppressed, and an effect as a carrier trap layer can be sustained.

As described above, the method for manufacturing a bonded SOI wafer of the present invention can suppress single-crystallization due to a heat treatment step of a step for manufacturing an SOI wafer or a heat treatment of a step for manufacturing a device after deposition by previously forming an oxide film between the surface of a silicon single crystal of a base wafer and a polycrystalline silicon layer to be deposited.

Moreover, by setting the deposition temperature to a temperature of 900° C. or more, it is possible to suppress grain growth and to sustain an effect as a carrier trap layer thereby, even when the temperature of a heat treatment step of a step for manufacturing an SOI wafer or a heat treatment of a step for manufacturing a device is relatively high (e.g., about 1000 to 1200° C.)

The bonded SOI wafer of the present invention can suppress single-crystallization of the polycrystalline silicon layer, and can sustain an effect as a carrier trap layer thereby, by making the oxygen concentration at the boundary of the base wafer and the polycrystalline silicon layer higher than the oxygen concentration in the base wafer and the oxygen concentration in the polycrystalline silicon layer.

DETAILED DESCRIPTION OF THE PREFERRED EMBODIMENTS

Hereinafter, the present invention will be described in detail as an example of the embodiment with reference to the drawings, but the present invention is not restricted thereto.

As described above, it comes to be necessary to form a carrier trap layer under a BOX layer of an SOI wafer in order to manufacture a device which can cope with higher frequency. However, when an ordinary polycrystalline silicon layer is deposited to form a carrier trap layer, there has been a problem in which the polycrystalline silicon layer is annealed to occur single-crystallization depending on a thermal history during the step for manufacturing an SOI wafer or the step for manufacturing a device, and to cause to decrease the effect as a carrier trap layer.

Accordingly, the present inventors have diligently investigated on the method for manufacturing an SOI wafer which can deposit a polycrystalline silicon layer or an amorphous silicon layer so as not to promote single-crystallization even though being subjected to a heat treatment step in a step for manufacturing an SOI wafer or a heat treatment step in a step for manufacturing a device.

As a result, the present inventors have found that it is possible to suppress single-crystallization due to a heat treatment step of a step for manufacturing an SOI wafer or a heat treatment of a step for manufacturing a device after deposition by previously forming an oxide film between the surface of a silicon single crystal of a base wafer and a polycrystalline silicon layer to be deposited, and it is possible to suppress grain growth of the polycrystalline silicon layer and to sustain an effect as a carrier trap layer by setting the deposition temperature to a temperature of 900° C. or more, even when the temperature of a heat treatment step of a step for manufacturing an SOI wafer or a heat treatment of a step for manufacturing a device is relatively high (e.g., about 1000 to 1200° C.); thereby bringing the present invention to completion.

Hereinafter, an example of an embodiment of the inventive method for manufacturing a bonded SOI wafer will be explained with reference to FIGS. 1 to 2.

Figure 1:
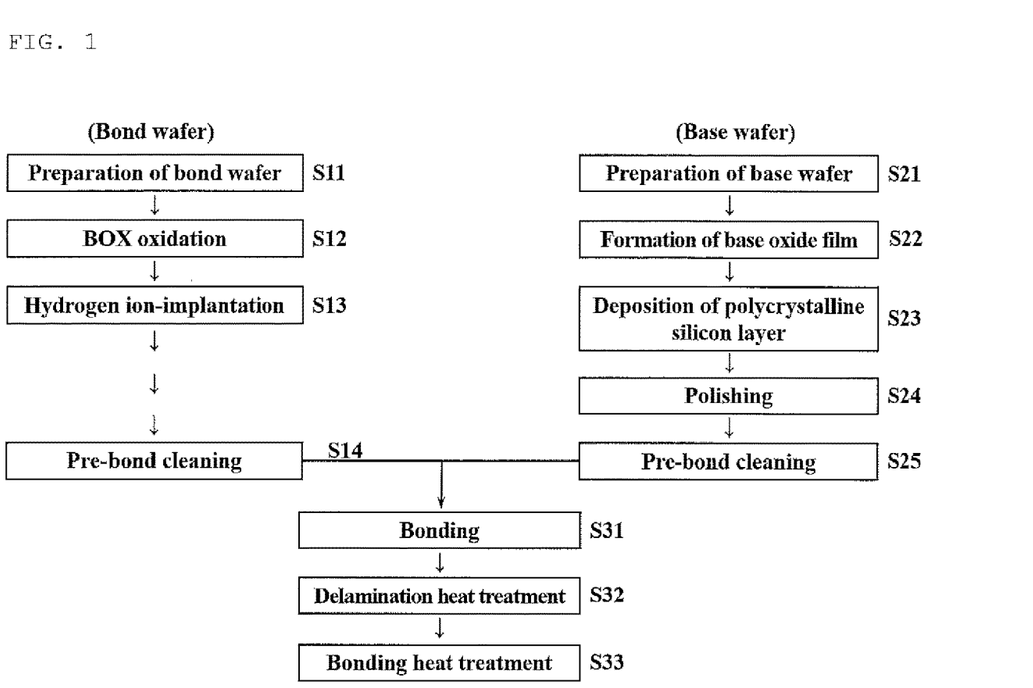
FIG. 1 is a production flow exemplifying an example of an embodiment of the method for manufacturing a bonded SOI wafer of the present invention.
Figure 2:
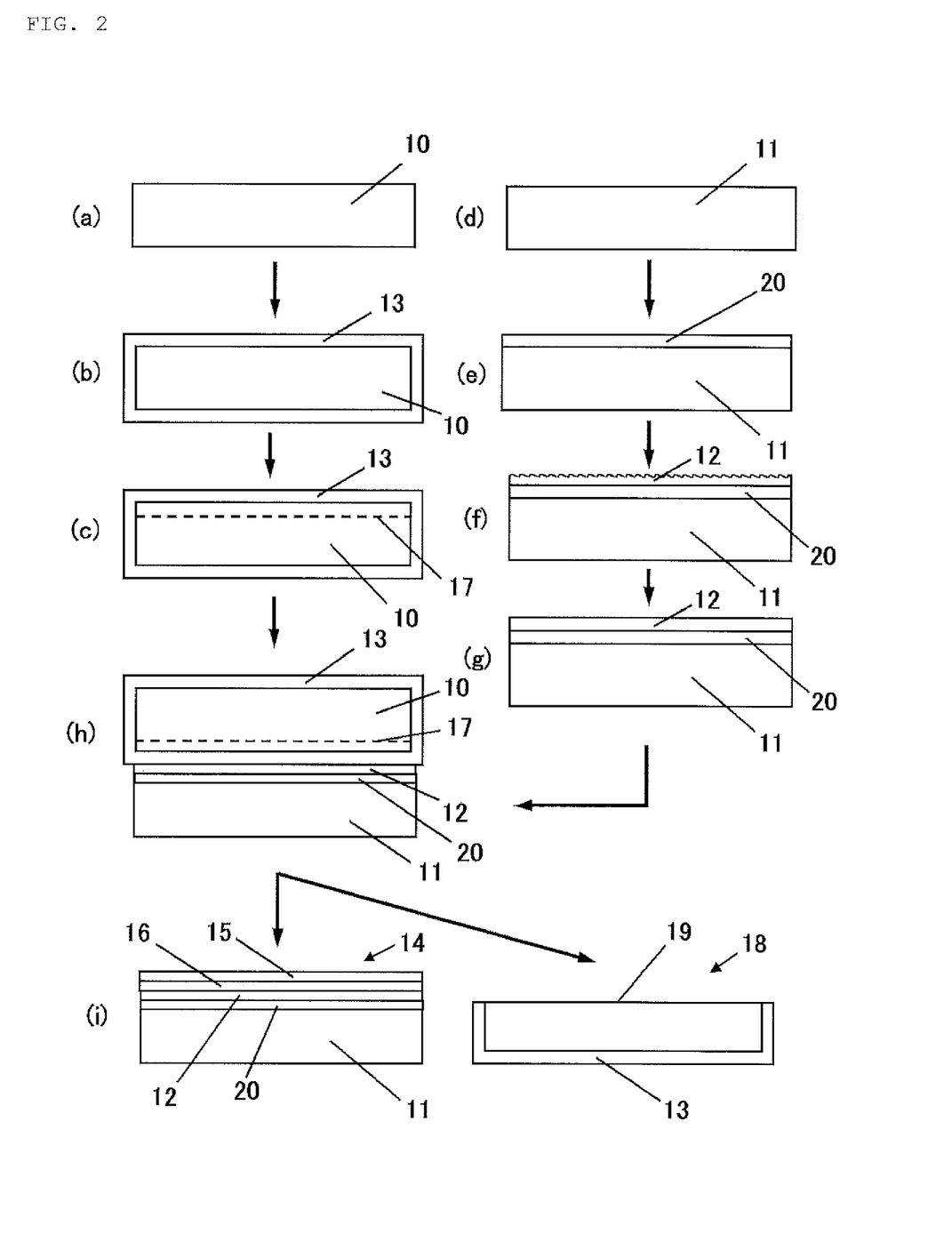
FIG. 2 is a sectional process view exemplifying an example of an embodiment of the method for manufacturing a bonded SOI wafer of the present invention.

First, a bond wafer 10 composed of a silicon single crystal is prepared (see Step S11 in FIG. 1 and FIG. 2(a)).

Then, on the bond wafer 10, an insulator film (e.g., an oxide film) 13, which forms a buried oxide film layer (a BOX layer) 16, is grown by thermal oxidation or CVD or the like, for example (see Step S12 in FIG. 1 and FIG. 2(b)).

Subsequently, from upper side of the insulator film 13, at least one gas ion selected from a hydrogen ion and a rare gas ion is implanted to form an ion-implanted layer 17 in the bond wafer 10 with an ion-implantation apparatus (see Step S13 in FIG. 1 and FIG. 2(c)). In this case, an accelerating voltage of the ion-implantation can be selected such that a targeted thickness of an SOI layer 15 can be obtained.

Then, in order to remove particles on the bonding surface of the bond wafer 10, pre-bond cleaning is performed (see Step S14 in FIG. 1).

On the other hand, a base wafer 11 composed of a silicon single crystal is prepared in addition to the bond wafer (see Step S21 in FIG. 1 and FIG. 2 (d)).

Then, on the base wafer 11, an oxide film (a base oxide film) 20 is formed (see Step S22 in FIG. 1 and FIG. 2(e)). The thickness of the oxide film 20 is not particularly limited. However, the thickness of the oxide film to be formed is preferably thinner, for example, the thickness of 0.3 nm or more and 10 nm or less is preferable, since the interposed oxide film 20 between the base wafer 11 and the polycrystalline silicon layer 12 can influence property of an RF device.

The method to form an oxide film with such a thickness includes wet cleaning as the most convenient method. Specifically, a uniform oxide film with a thickness of approximately 0.5 to 3 nm can be formed by cleaning with SOI (a mixed aqueous solution of $NH_4OH$ and $H_2O_2$), SC2 (a mixed aqueous solution of HCl and $H_2O_2$), sulfuric acid-hydrogen peroxide water mixture (a mixed aqueous solution of $H_2SO_4$ and $H_2O_2$), ozone water, etc., or a mixture thereof.

Subsequently, on the oxide film (the base oxide film) 20, a polycrystalline silicon layer 12 is deposited (see Step S23 in FIG. 1 and FIG. 2(f)). Here, the deposition temperature is set to 900° C. or more.

When the deposition temperature is 900° C. or higher than 900° C., it is possible to suppress grain growth of a polycrystalline silicon layer and to sustain an effect as a carrier trap layer thereby, even when the temperature of a heat treatment step of a step for manufacturing an SOI wafer or a heat treatment of a step for manufacturing a device is relatively high (e.g., about 1000 to 1200° C.)

Moreover, when the deposition temperature is 900° C. or higher than 900° C., it is possible to deposit the polycrystalline silicon layer 12 at atmospheric pressure with high speed by using a general CVD equipment for epitaxial growth and trichlorosilane as a source gas.

The upper limit of the deposition temperature is not particularly limited so long as polycrystalline silicon grows. However, it is not necessary to be higher than the maximum temperature in a step for manufacturing an SOI wafer or a step for manufacturing a device (if it is higher, slip dislocation or metallic contamination is apt to occur), and accordingly it is preferable to set to the maximum temperature or lower, for example, 1200° C. or less.

Then, the surface of the polycrystalline silicon layer 12 deposited on the base wafer 11 is flattened by polishing (see Step S24 in FIG. 1 and FIG. 2(g)). The polycrystalline silicon layer 12 deposited at a temperature of 900° C. or more has a large surface roughness, and is difficult to bond as it is thereby. Accordingly, it is necessary to flatten the surface of the polycrystalline silicon layer 12 by polishing.

Subsequently, pre-bond cleaning is performed in order to remove particles on the surface of the polished polycrystalline silicon layer 12 (see Step S25 in FIG. 1).

It is to be noted that Steps S11 to S14 in FIG. 1 and Steps S21 to S25 in FIG. 1 can be conducted in parallel.

Then, the base wafer 11 on which the polycrystalline silicon layer 12 has been formed and the bond wafer 10 on which the insulator film 13 has been formed are adhered to be bonded in such a way that the implanted surface of the bond wafer 10 is in contact with the side of the base wafer 11 on which the polycrystalline silicon layer 12 has been formed (see Step S31 in FIG. 1 and FIG. 2(h)).

Subsequently, the bonded wafer is subjected to a heat treatment to generate a micro bubble layer in the ion-implanted layer 17 (a delamination heat treatment), and is delaminated along the generated micro bubble layer to produce a bonded wafer 14 in which the buried oxide film layer 16 and the SOI layer 15 are formed on the base wafer 11 (see Step S32 in FIG. 1 and FIG. 2 (i)). It is to be noted that in this step, a delaminated wafer 18 having a delaminating plane 19 is derived.

Then, the bonded wafer 14 is subjected to a bonding heat treatment in order to enhance the bond strength at the interface of bonding (see Step S33 in FIG. 1).

As described above, a bonded SOI wafer can be manufactured.

In the method for manufacturing a bonded SOI wafer of the present invention, it is possible to suppress single-crystallization due to a heat treatment step of a step for manufacturing an SOI wafer or a heat treatment of a step for manufacturing a device after deposition by previously forming an oxide film between the surface of a silicon single crystal of a base wafer and a polycrystalline silicon layer to be deposited, and it is possible to suppress grain growth of the polycrystalline silicon layer and to sustain an effect as a carrier trap layer since the deposition temperature of the polycrystalline silicon layer is set to a temperature of 900° C. or more, even when the temperature of a heat treatment step of a step for manufacturing an SOI wafer or a heat treatment of a step for manufacturing a device is relatively high (e.g., about 1000 to 1200° C.).

When an underlying oxide film is formed in several nm by wet cleaning, if the temperature for depositing a polycrystalline silicon layer thereon is 1010° C. or less, it is possible to suppress promoting single-crystallization of the polycrystalline silicon layer due to contact between the surface of a silicon single crystal of a base wafer and the polycrystalline silicon layer caused by disappearance of a part of an underlying oxide film during a step for depositing the polycrystalline silicon layer.

In order to enhance an effect as a carrier trap layer, it is preferable to thicken the thickness of a polycrystalline silicon layer. Still, when the thickness of a polycrystalline silicon layer is thicker, the warpage of a wafer after deposition becomes larger, thereby causing a bond failure.

The warpage of a wafer can be suppressed, however, by performing a heat treatment in a non-oxidizing atmosphere at a temperature higher than the temperature at which the polycrystalline silicon layer is deposited after depositing a polycrystalline silicon layer and before bonding. As the non-oxidizing atmosphere, a hydrogen gas atmosphere can be included, for example. The hydrogen gas atmosphere can be easily exchanged only by stopping an introduction of source gas after depositing the polycrystalline silicon layer.

By setting the thickness of the polycrystalline silicon layer to be 2 μm or more when the base wafer and the bond wafer are bonded, the frequency of a bond failure increases due to warpage of a wafer. However, when a heat treatment is performed in a non-oxidizing atmosphere at a high temperature after depositing the polycrystalline silicon layer (before bonding), the warpage of a wafer can be suppressed, and accordingly the bond failure can be lowered while enhancing the effect as a carrier trap layer, even when the thickness of the polycrystalline silicon layer is 2 μm or more when the base wafer and the bond wafer are bonded.

It is to be noted that the heat treatment in a non-oxidizing atmosphere at a high temperature may be performed either before or after the step for polishing the surface of the polycrystalline silicon layer. However, the heat treatment is preferably performed before polishing since bond failure can be lowered by bonding a base wafer and a bond wafer without performing steps other than cleaning after the base wafer is polished.

The polycrystalline silicon layer also has a thickness of 10 μm or less when the base wafer and the bond wafer are bonded.

The base wafer 11 can be preferably used for manufacturing a radio frequency device so long as it has a resistivity of 100 Ω·cm or more, which is further preferably 1000 Ω·cm or more, particularly preferably 3000 Ω·cm or more. The upper limit of the resistivity is not particularly limited, but it can be 50000 Ω·cm, for example.

Figure 3:
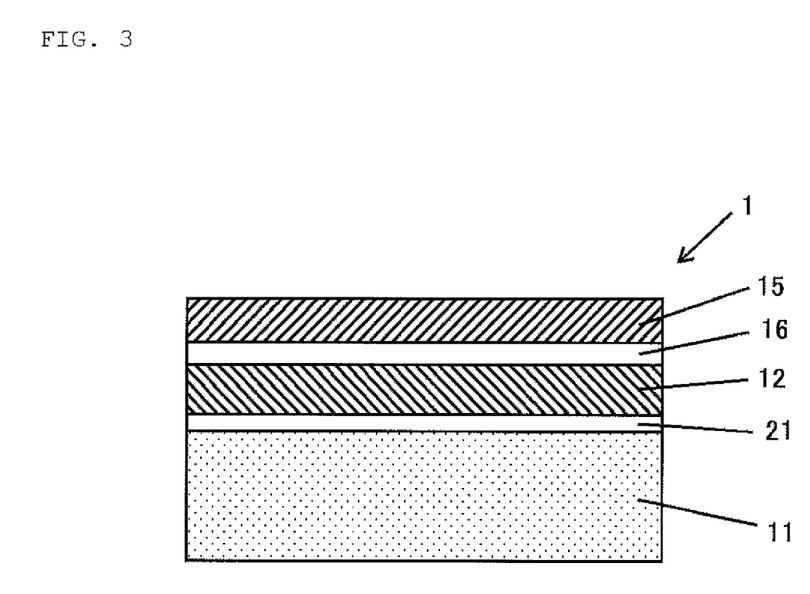
FIG. 3 is a cross sectional view of the bonded SOI wafer of the present invention.

Subsequently, the bonded SOI wafer of the present invention will be explained with reference to FIG. 3.

The bonded SOI wafer 1 of the present invention comprises a base wafer 11 composed of a silicon single crystal, a polycrystalline silicon layer 12 on the base wafer 11, an insulator film 16 on the polycrystalline silicon layer 12, and an SOI layer 15 on the insulator film 16; wherein the base wafer 11 has a resistivity of 100 Ω·cm or more, and the oxygen concentration at the boundary 21 of the base wafer 11 and the polycrystalline silicon layer 12 is higher than the oxygen concentration in the base wafer 11 and the oxygen concentration in the polycrystalline silicon layer 12.

When the oxide film, which is formed before depositing the polycrystalline silicon layer 12, is formed by wet cleaning, the formed oxide film is thin, and the underlying oxide film is apt to eliminate thereby when the polycrystalline silicon layer 12 is deposited at a temperature of 900° C. or more. When the deposition temperature is relatively low (e.g., 1010° C. or less), however, the diffusion of oxygen does not proceeds sufficiently. Accordingly, oxygen remains at the boundary (an interfacial portion) 21 of the base wafer 11 and the polycrystalline silicon layer 12 in high concentration. This can suppress single-crystallization of the polycrystalline silicon layer, and can sustain an effect as a carrier trap layer.

EXAMPLES

Hereinafter, the present invention will be described in more detail with reference to Examples and Comparative Examples, but the present invention is not restricted thereto.

Example 1

By using a manufacturing method explained in FIGS. 1 to 2, a bonded SOI wafer was produced. Provided that a p-type single crystal silicon with a diameter of 200 mm, crystal orientation of <100>, and a resistivity of 700 Ω·cm was used as a base wafer; and formation of a base oxide film, deposition of polycrystalline silicon layer (trichlorosilane was used as a source gas), BOX oxidation, hydrogen ion-implantation, a delamination heat treatment, and a bonding heat treatment were performed under the following conditions:

formation of a base oxide film: SC1+SC2 cleaning, the film thickness of an oxide film: about 1 nm deposition of polycrystalline silicon layer: 900° C., atmospheric pressure, the film thickness: 1.0 μm (0.5 μm after polishing)

BOX oxidation: 1050° C., the film thickness of an oxide film: 400 nm hydrogen ion-implantation: 105 keV, $7.5 \times 10^{16}$/cm$^2$ delamination heat treatment: 500° C., 30 minutes, 100% Ar atmosphere bonding heat treatment: 900° C. pyrogenic oxidation+Ar annealing at 1100° C. for 120 minutes An post-deposition annealing was not performed.

The warpage of a wafer after polishing the polycrystalline silicon layer was measured, and the state of single-crystallization of the polycrystalline silicon layer after a bonding heat treatment was examined (confirmed by cross-sectional SEM observation).

The results are shown in Table 1.

Example 2

A bonded SOI wafer was produced in the same manner as in Example 1. Provided that the polycrystalline silicon layer was deposited under conditions of 920° C., atmospheric pressure, and a film thickness of 1.5 μm. (1.0 μm after polishing).

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Example 3

A bonded SOI wafer was produced in the same manner as in Example 1. Provided that the polycrystalline silicon layer was deposited under conditions of 940° C., atmospheric pressure, and a film thickness of 2.1 μm (1.6 μm after polishing).

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Example 4

A bonded SOI wafer was produced in the same manner as in Example 1. Provided that the polycrystalline silicon layer was deposited under conditions of 960° C., atmospheric pressure, and a film thickness of 2.9 μm (2.4 μm after polishing).

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Example 5

A bonded SOI wafer was produced in the same manner as in Example 1. Provided that the polycrystalline silicon layer was deposited under conditions of 980° C., atmospheric pressure, and a film thickness of 3.8 μm (3.3 μm after polishing).

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Example 6

A bonded SOI wafer was produced in the same manner as in Example 1. Provided that the polycrystalline silicon layer was deposited under conditions of 1000° C., atmospheric pressure, and a film thickness of 3.5 μm (3.0 μm after polishing).

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Moreover, regarding the produced bonded SOI wafer, an existence of an oxide film at the boundary of the polycrystalline silicon layer and the base wafer by electron microscope observation (cross-sectional SEM observation and cross-sectional TEM observation). The oxygen concentration of the boundary was measured by SIMS (Secondary Ion Mass Spectrometry).

As a result, a layered-continuous oxide film was not observed at the boundary by visual inspection of the electron microscope image. The oxygen concentration of each of the base wafer and the polycrystalline silicon layer was $1 \times 10^{17}$ to $2 \times 10^{17}$ atoms/cm$^3$. On the other hand, the boundary showed higher peaks than the oxygen concentrations in the base wafer and in the polycrystalline silicon layer, and the maximum value of the peak was about $8 \times 10^{20}$ atoms/cm$^3$.

Example 7

A bonded SOI wafer was produced in the same manner as in Example 1. Provided that the polycrystalline silicon layer was deposited under conditions of 1000° C., atmospheric pressure, and a film thickness of 4.9 μm (3.0 μm after polishing); and post-deposition annealing was performed before bonding under conditions of 1130° C., 10 minutes, and 100% H$_2$.

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Example 8

A bonded SOI wafer was produced in the same manner as in Example 1. Provided that the polycrystalline silicon layer was deposited under conditions of 1010° C., atmospheric pressure, and a film thickness of 5.5 μm (5.0 μm after polishing).

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Example 9

A bonded SOI wafer was produced in the same manner as in Example 1. Provided that the base oxide film was formed under conditions of 800° C., dry O$_2$ oxidation, the oxide film thickness: 30 nm; and the polycrystalline silicon layer was deposited under conditions of 1040° C., atmospheric pressure, and a film thickness of 1.5 μm (1.0 μm after polishing).

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Comparative Example 1

A bonded SOI wafer was produced in the same manner as in Example 1. Provided that the polycrystalline silicon layer was deposited (monosilane was used as a source gas) under conditions of 650° C., reduced pressure, and a film thickness of 1.5 μm (1.0 μm after polishing).

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Comparative Example 2

A bonded SOI wafer was produced in the same manner as in Example 1. Provided that the polycrystalline silicon layer was deposited under conditions of 850° C., atmospheric pressure, and a film thickness of 1.5 μm (1.0 μm after polishing).

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Comparative Example 3

A bonded SOI wafer was produced in the same manner as in Example 1. Provided that the polycrystalline silicon layer was deposited under conditions of 1020° C., atmospheric pressure, and a film thickness of 6.1 μm.

In Comparative Example 3, deposition of single crystal was confirmed by SEM observation after depositing a polycrystalline silicon layer, and a polycrystalline silicon layer failed to deposit thereby. Accordingly, the subsequent steps were not performed.

TABLE 1

| | | Example 1 | Example 2 | Example 3 | Example 4 | Example 5 | Example 6 | Example 7 |
|---|---|---|---|---|---|---|---|---|
| Base wafer | | Diameter: 200 mm, Crystal orientation: <100>, Resistivity: 700 Ω · cm, P-type | | | | | | |
| Conditions for forming base oxide film | | SC1 + SC2 cleaning, forming oxide film thickness of ca. 1 nm | | | | | | |
| Conditions for depositing polycrystalline silicon layer | Temperature | 900° C. | 920° C. | 940° C. | 960° C. | 980° C. | 1000° C. | 1000° C. |
| | Pressure | Atmospheric pressure | | | | | | |
| | Thickness (before polishing) | 1.0 μm | 1.5 μm | 2.1 μm | 2.9 μm | 3.8 μm | 3.5 μm | 4.9 μm |
| | Annealing after deposition | None | None | None | None | None | None | 100% H2 1130° C. 10 min. |

TABLE 1-continued

|  |  | | | | | | | |
|---|---|---|---|---|---|---|---|---|
| Thickness (after polishing) | | 0.5 μm | 1.0 μm | 1.6 μm | 2.4 μm | 3.3 μm | 3 μm | 3 μm |
| Warpage of wafer after polishing polycrystalline silicon layer | | 37 μm | 47 μm | 61 μm | 70 μm | 77 μm | 55 μm | 10 μm |
| State of single-crystallization of polycrystalline silicon layer (at completion of SOI wafer) | | | | | No problem | | | |

|  |  | Example 8 | Example 9 | Comparative Example 1 | Comparative Example 2 | Comparative Example 3 |
|---|---|---|---|---|---|---|
| Base wafer | | | Diameter: 200 mm, Crystal orientation: <100>, Resistivity: 700 Ω · cm, P-type | | | |
| Conditions for forming base oxide film | | SC1 + SC2 cleaning, forming oxide film thickness of ca. 1 nm | 800° C. dry O2 oxidation forming oxide film thickness or 30 nm | SC1 + SC2 cleaning, forming oxide film thickness of ca. 1 nm | | |
| Conditions for depositing polycrystalline silicon layer | Temperature | 1010° C. | 1040° C. | 650° C. | 850° C. | 1020° C. |
| | Pressure | Atmospheric pressure | Atmospheric pressure | Reduced pressure | Atmospheric pressure | Atmospheric pressure |
| | Thickness (before polishing) | 5.5 μm | 1.5 μm | 1.5 μm | 1.5 μm | 6.1 μm |
| | Annealing after deposition | None | None | None | None | Single crystal was confirmed by SEM observation Accordingly post-steps were not performed |
| | Thickness (after polishing) | 5.0 μm | 1.0 μm | 1.0 μm | 1.0 μm | |
| Warpage of wafer after polishing polycrystalline silicon layer | | 65 μm | 60 μm | 12 μm | 25 μm | |
| State of single-crystallization of polycrystalline silicon layer (at completion of SOI wafer) | | No problem | | Single-crystallized | | |

As can be seen from Table 1, in Examples 1 to 8 and Comparative Examples 1 to 3, which formed each base oxide film by wet cleaning, single-crystallization of each polycrystalline silicon layer did not occurred in Examples 1 to 8, which deposited each polycrystalline silicon layer at a temperature of 900° C. or more and 1010° C. or less. On the other hand, in Comparative Examples 1 to 3, which deposited each polycrystalline silicon layer at a temperature out of the range described above, there occurred single-crystallization of each polycrystalline silicon layer.

In Example 9, which formed the base oxide film by dry $O_2$ oxidation, single-crystallization of the polycrystalline silicon layer was not occurred, although the polycrystalline silicon layer was deposited at 1040° C. It is supposed that this is because the base oxide film did not disappear by the heat treatment in a post-step since the base oxide film is formed to be relatively thick with the thickness of 30 nm.

Furthermore, in Example V, which performed annealing after deposition, the warpage of a wafer was lowered.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a bonded SOI wafer by bonding a bond wafer and a base wafer, each composed of a silicon single crystal, via an insulator film, comprising, in sequential order, the steps of:
    depositing a polycrystalline silicon layer on the bonding surface side of the base wafer, wherein the polycrystalline silicon layer is deposited at a temperature of 1010° C. or less,
    polishing a surface of the polycrystalline silicon layer,
    forming the insulator film on the bonding surface of the bond wafer,
    forming an ion-implanted layer in the bond wafer,
    bonding the polished surface of the polycrystalline silicon layer of the base wafer and the bond wafer via the insulator film, and
    thinning the bonded bond wafer by delaminating along the ion-implanted layer in the bond wafer to form an SOI layer; wherein,
    as the base wafer, a silicon single crystal wafer having a resistivity of 100 Ω·cm or more is used,
    the step for depositing the polycrystalline silicon layer further comprises a stage for previously forming an oxide film on the surface of the base wafer on which the polycrystalline silicon layer is deposited,
    the polycrystalline silicon layer is deposited at a temperature of 900° C. or more,
    the polycrystalline silicon layer is deposited by atmospheric pressure CVD,
    the oxide film is formed by wet cleaning, and
    the oxide film has a thickness of 0.3 nm or more and 10 nm or less.

2. The method for manufacturing a bonded SOI wafer according to claim 1, wherein a heat treatment is performed in a non-oxidizing atmosphere at a temperature higher than the temperature at which the polycrystalline silicon layer is deposited after depositing the polycrystalline silicon layer, and afterward the base wafer and the bond wafer are bonded.

3. The method for manufacturing a bonded SOI wafer according to claim 2, wherein the polycrystalline silicon layer has a thickness of 2 µm or more when the base wafer and the bond wafer are bonded.

* * * * *